(12) United States Patent
Lin et al.

(10) Patent No.: US 6,406,274 B1
(45) Date of Patent: Jun. 18, 2002

(54) HEAT DISSIPATION DEVICE HAVING CENTRIFUGAL BLADES

(75) Inventors: Kuo-cheng Lin; Yu-huang Huang; Ming-shi Tsai; Wen-shi Huang, all of Taoyan Shien (TW)

(73) Assignee: Delta Electronics, Inc. (TW)

( * ) Notice: Subject to any disclaimer, the term of this patent is extended or adjusted under 35 U.S.C. 154(b) by 0 days.

(21) Appl. No.: 09/580,002

(22) Filed: May 26, 2000

(30) Foreign Application Priority Data

Mar. 1, 2000 (TW) ...................................... 89203323 U

(51) Int. Cl.[7] .......................... F04B 35/04; F04D 29/38; H05K 7/20
(52) U.S. Cl. .................... 417/354; 417/423.1; 416/183; 361/695
(58) Field of Search .............................. 417/423.1, 354; 310/58, 60, 60 A, 62, 91; 416/182, 183; 361/695

(56) References Cited

U.S. PATENT DOCUMENTS

| | | | | | |
|---|---|---|---|---|---|
| 3,274,410 | A | * | 9/1966 | Boivie | 416/183 |
| 5,917,262 | A | * | 6/1999 | Huang et al. | 310/254 |
| 6,111,748 | A | * | 8/2000 | Bhatia | 361/695 |
| 6,157,104 | A | * | 12/2000 | Yokozawa et al. | 310/58 |

* cited by examiner

*Primary Examiner*—Charles G. Freay
(74) *Attorney, Agent, or Firm*—Martine & Penilla, LLP

(57) ABSTRACT

A heat dissipation device includes a rotor, a plurality of centrifugal blades provided around the rotor, a stator provided inside the rotor for driving the rotor to rotate, and a base provided under the rotor and the stator without enclosing the rotor. The base includes a central portion connected with the stator, and a plurality of extension portions extending from the central portion to the outside. A plurality of holes are formed at a side of each of the plurality of extension portions away from the central portion, respectively.

7 Claims, 5 Drawing Sheets

HEAT DISSIPATION DEVICE HAVING CENTRIFUGAL BLADES

FIELD OF THE INVENTION

The invention relates to a heat dissipation device, in particular, to an open-type heat dissipation device having centrifugal blades and having no outer frames.

BACKGROUND OF THE INVENTION

As an electrical element increases its operation speed, a large amount of heat energy is generated. For a small-size electrical device (e.g. a notebook) having a large number of electrical elements, heat dissipation efficiency directly influences the performance of the electrical device.

Referring to FIG. 1, a heat dissipation fan 10 includes a rotor 11 having a plurality of axial-flow blades, a stator 12, and an outer frame 13. Both the rotor 1 1 and the stator 12 are located within the outer frame 13. The rotor 1 1 has axial-flow blades and is driven to rotate by the stator 12.

The axial-flow heat dissipation fan 10 has drawbacks, which are described in the following.

First, to mount the heat dissipation fan 10, a predetermined space corresponding to the size of the outer frame 13 has to be provided within the electrical device. This is disadvantageous to small electrical devices. Flexibility in arrangement of the heat dissipation fan 10 is also restricted.

Referring to FIG. 2A, the arrangement of the axial-flow heat dissipation fan 10 and the electrical elements 20 creates a large system impedance and a poor heat dissipation effect because the air-flow from the axial-flow heat dissipation fan 10 is immediately blocked by the electrical elements 20.

Referring to FIG. 2B, which shows the arrangement of the axial-flow heat dissipation fan 10, and the electrical elements 20, the system impedance is small. However, to contain the axial-flow heat dissipation fan 10, additional space is needed for the electrical device due to the height of the axial-flow heat dissipation fan 10.

Furthermore, the axial-flow heat dissipation fan 10 is not suitable for a high impedance operation. Common electrical devices tend to be small in size, and the density of electrical elements mounted therein is thus increased. Air-flow impedance increases with the increasing density of the electrical elements of the electrical device. Thus, when using the axial-flow heat dissipation fan 10, the heat dissipation effect is poor.

In order to eliminate the above drawbacks of heat dissipation in an electrical device, a centrifugal fan that provides a large amount of air pressure is often used instead of an axial-flow fan. An example of this is the centrifugal fan disclosed in U.S. Pat. No. 5,912,802, in which a blower and heat dissipation fins are placed close to the electrical devices to improve the heat dissipation effect. However, this does not eliminate the drawbacks illustrated in FIG. 2B.

SUMMARY OF THE INVENTION

It is therefore an object of the invention to provide a heat dissipation device having centrifugal blades and occupying a small space.

Another object of the invention is to provide a heat dissipation device having centrifugal blades in order to broaden the usage and flexibility in mounting the device.

A further object of the invention is to provide a heat dissipation device having centrifugal blades in order to produce a large amount of air pressure, which is advantageous to the heat dissipation effect of the electrical device.

A final object of the invention is to provide a heat dissipation device having centrifugal blades in order to simplify the structure and the assembly of the heat dissipation device and thereby lower manufacturing costs.

To achieve the above objectives, the heat dissipation device in accordance with the invention includes a rotor, a plurality of centrifugal blades around the rotor, a stator inside the rotor for driving the rotor to rotate, and a base under the rotor and the stator without enclosing the rotor. The base includes a central portion connected with the stator, and a plurality of extension portions extending from the central portion outward. Away from the central portion, a plurality of holes is formed on each of the plurality of extension portions, respectively.

The heat dissipation device can be used in conjunction with various heat dissipation elements such as the heat dissipation fins mounted above the electrical elements in the electrical device, or heat pipes that can transfer heat energy. Therefore, the heat dissipation effect can be improved.

Furthermore, compared with the conventional axial-flow blades, the centrifugal blades in this invention create a larger air-flow resistance thereby producing a better heat dissipation effect.

Moreover, due to the open-type structure and lack of any outer frame, the heat dissipation device is small and allows flexibility in mounting and usage.

In addition, the structure of the base allows the heat dissipation device to be stably mounted in the electrical device while the manufacturing costs are lowered, as the amount of material wasted is minimal.

DETAILED DESCRIPTION OF THE PREFERRED EMBODIMENTS

The heat dissipation device having centrifugal blades in accordance with a preferred embodiment of the invention will be described with reference to the accompanying drawings.

Figure 3A:
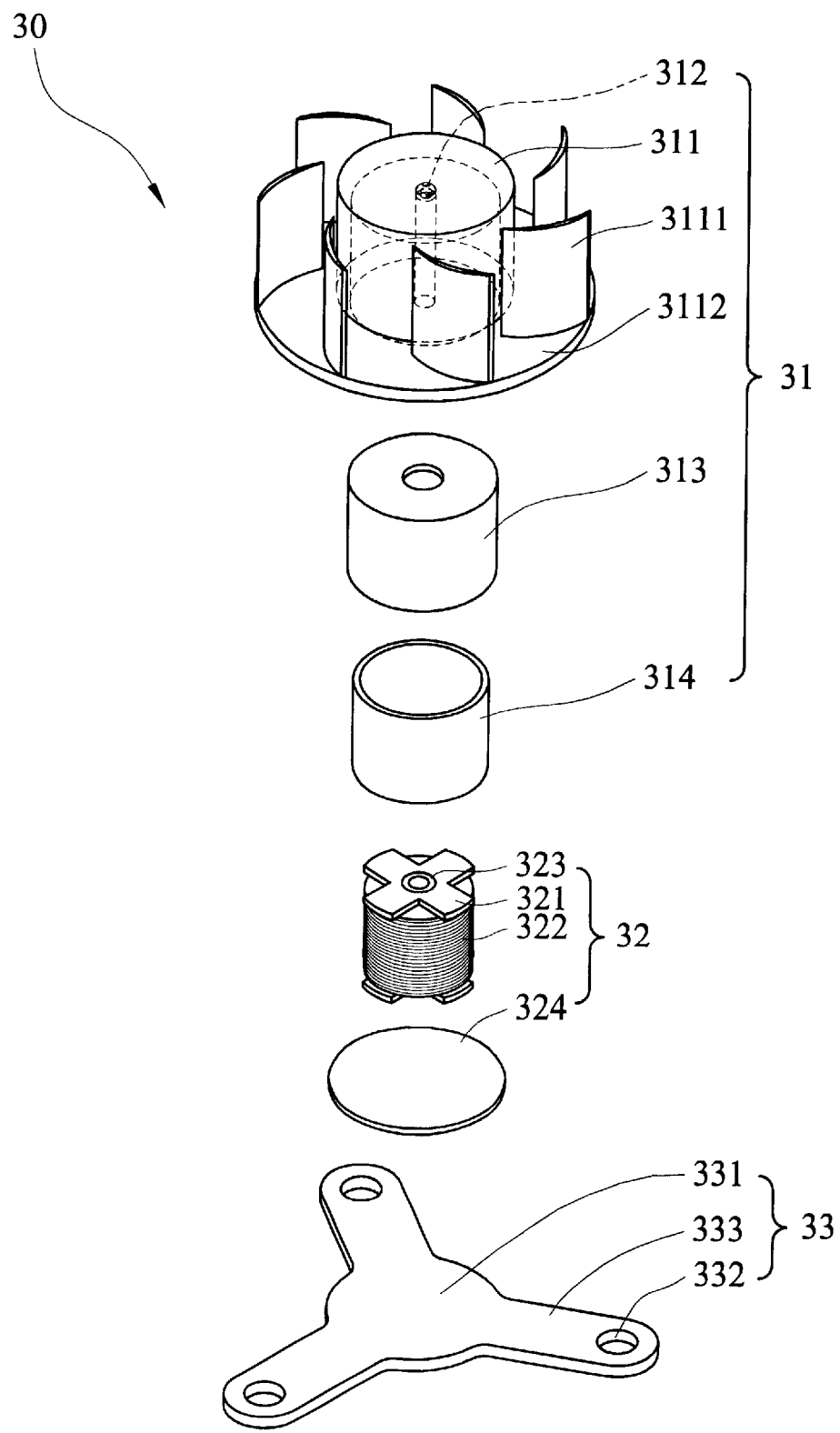
FIG. 3A is a pictorial view showing a heat dissipation device in accordance with a preferred embodiment of the invention.
Figure 3B:
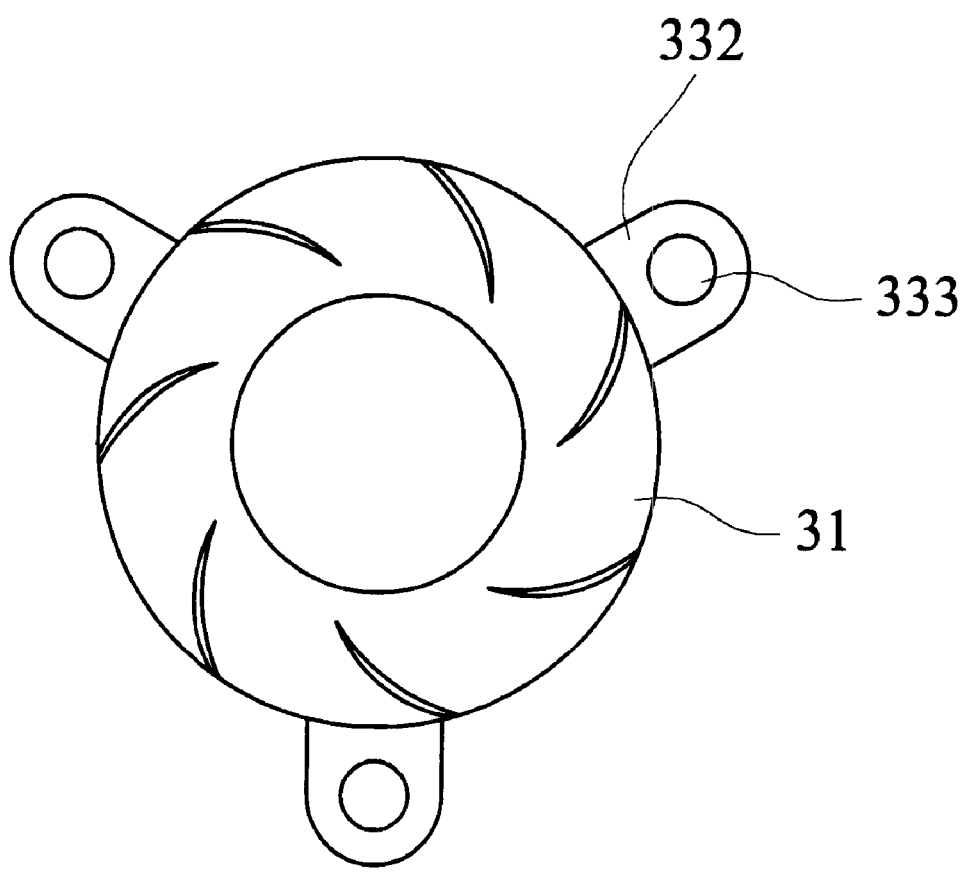
FIG. 3B is a top view showing the heat dissipation device in accordance with the preferred embodiment of the invention.

Referring to FIG. 3A, a heat dissipation device 30 includes a rotor 31, a stator 32, and a base 33. The stator 32 is located within the rotor 31 and drives the rotor 31 to rotate. The base 33 is under the rotor 31 and the stator 32 without enclosing the rotor 31.

The rotor 31 includes a hub 311, a plurality of centrifugal blades 3111, a rotation shaft 312, a shielding can 313, and a rotor magnet 314. The hub 311 is a cup-shaped structure around which a projecting portion 3112 is formed. The centrifugal blades 3111 are located on the projecting portion 3112 around the hub 311. The rotation shaft 312 is vertically situated at the center of the inner top-side of the hub 311. The shielding can 313 is inside the hub 311, and the rotor magnet 314 is located around the inside of the shielding can 313.

The stator 32 includes a magnetic element 321, an insulation portion 323 surrounding the magnetic element 321, a coil 322 wound around the insulation portion 323, and a circuit board 324 mounted under the magnetic element 321, the coil 322, and the insulation portion 323. The stator structure is thus completed.

The magnetic element 321, coil 322, and insulation portion 323 of the stator 32 are located inside the rotor 31. The rotation shaft 312 of the rotor 31 penetrates through the center of the stator 32. The rotor 31 is able to rotate relative to the stator 32 with the rotation shaft 312 as a rotation axis and using a bearing or bearings.

When the coil 322 of the stator 32 is ON and magnetized, the induced magnetic field interacts with the rotor magnet 314 of the rotor 31 via the magnetic element 321 for driving the rotor 31 to rotate. The rotation speed of the rotor 31 is controlled by the circuit configuration (not shown) on the circuit board 324. Therefore, the air pressure and the air-flow are easily adjusted.

It should be noted that there are other modifications for both the rotor 31 and the stator 32. For example, it could vertically situate the rotation shaft 312 at the center of the inner top-side of the shielding can 313, and it could eliminate the circuit board 324 of the stator 32 and connect the rotor 31 directly to the electric power source.

The base 33 in the embodiment is composed of a plate. The base 33 has a central portion 331 and a plurality of extension portions 332. The central portion 331 is in contact with the stator 32 via adhesives, welding or other means of fastening. In this embodiment, the adhesive method is adopted. Each of the extension portions 332 is extended from the central portion 331 to the outside. Three holes 333 are respectively formed at one end of each of the extension portions 332 away from the central portion 331.

The heat dissipation device 30 can be mounted at a predetermined position on a heat dissipation plate (not shown) or other similar structure using three bolts (not shown) penetrating through the holes 333. It is preferable that each of the extension portions 332 is extended to the outside of the rotor 31 and the holes 333 are formed at parts of the extension portions 332 away from the rotor 31. Therefore, the assembly of the heat dissipation device 30 is simplified.

In the embodiment, the angles between two adjacent extension portions 332 are 120 degrees. However, the base 33 can be of any shape in so far as the positions of the holes 333 simplify the assembly of the heat dissipation device 30, increase stability and lower the manufacturing costs by reducing the amount of material used in manufacturing the device. In other words, the angles between two adjacent extension portions 332 and the positions of the holes 333 can be arbitrarily adjusted in order to match the arrangement of other elements in the electrical device. Thus, the best heat dissipation effect is attained with the smallest space. Furthermore, if the bolts (not shown) are used to install the heat dissipation device 30, parts of the bolts located above the base 33 will affect the air-flow from the heat dissipation device 30 as the heat dissipation device 30 is small and thin. Another objective of adjusting the shapes of the extension portions 332 and the positions of the holes 333 to prevent the bolts from affecting the air-flow out of the heat dissipation device 30. Moreover, the stator 32 can be mounted to cover the extension portions 332.

The heat dissipation device in accordance with the invention is small in size and simple in structure and is suitable for various functions. For example, a good heat dissipation effect is obtained by a proper arrangement of electrical elements or other heat dissipation elements, such as heat dissipation fins or heat pipes, in the electrical device. In other words, the design restriction is not so strict, and therefore the designer can improve the heat dissipation efficiency of the electrical device by considering other factors such as the arrangement of electrical elements or by adding other heat dissipation elements in the electrical device. This is because the heat dissipation device of the invention is of an open-type structure, small in size, and simple in structure and assembly.

Figure 1:
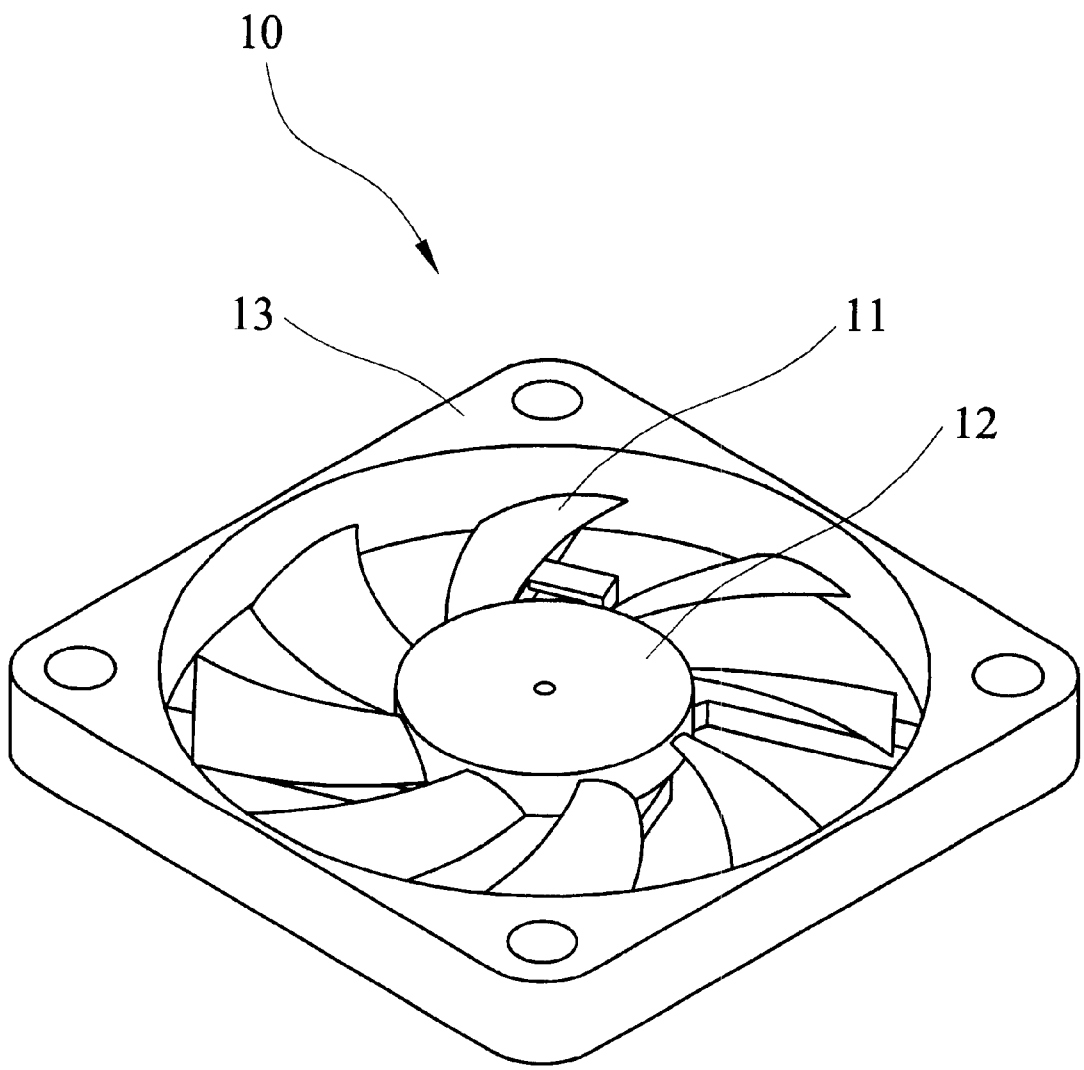
FIG. 1 is a schematic illustration showing a conventional axial-flow heat dissipation fan.
Figure 2A:
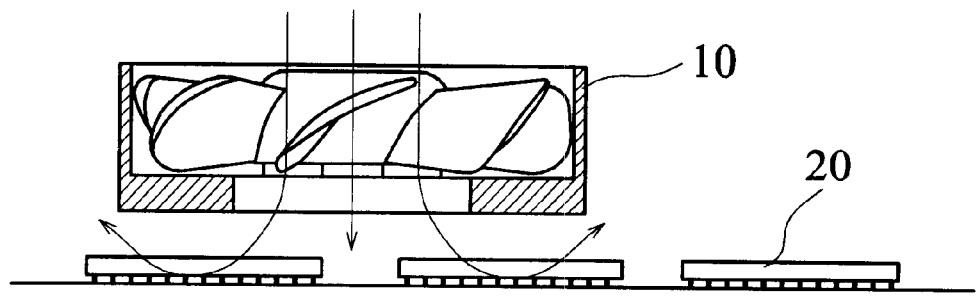
FIG. 2A is a schematic illustration showing an arrangement of a conventional axial-flow heat dissipation fan and electrical elements.
Figure 2B:
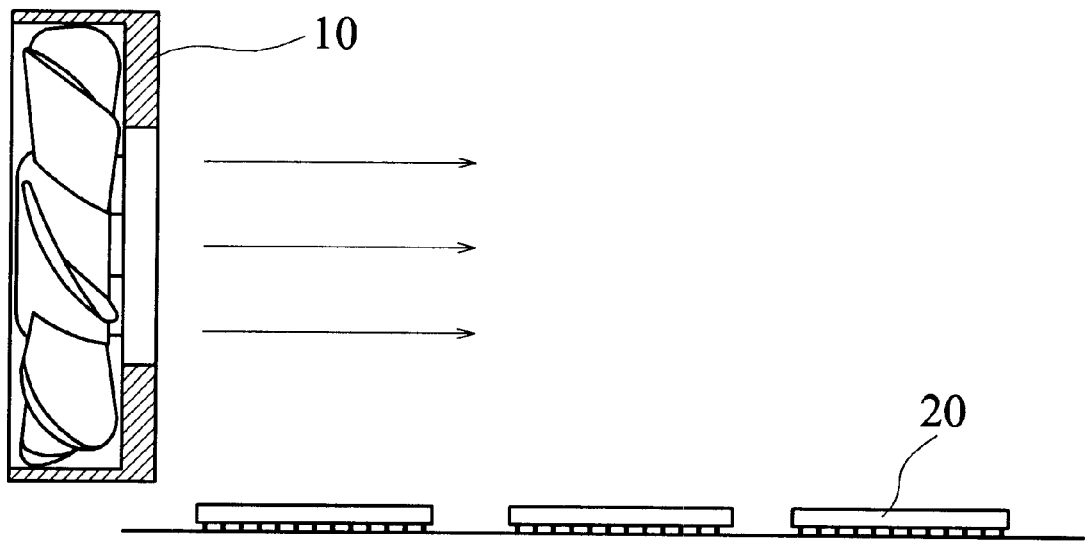
FIG. 2B is a schematic illustration showing another arrangement of a conventional axial-flow heat dissipation fan and electrical elements.
Figure 4:
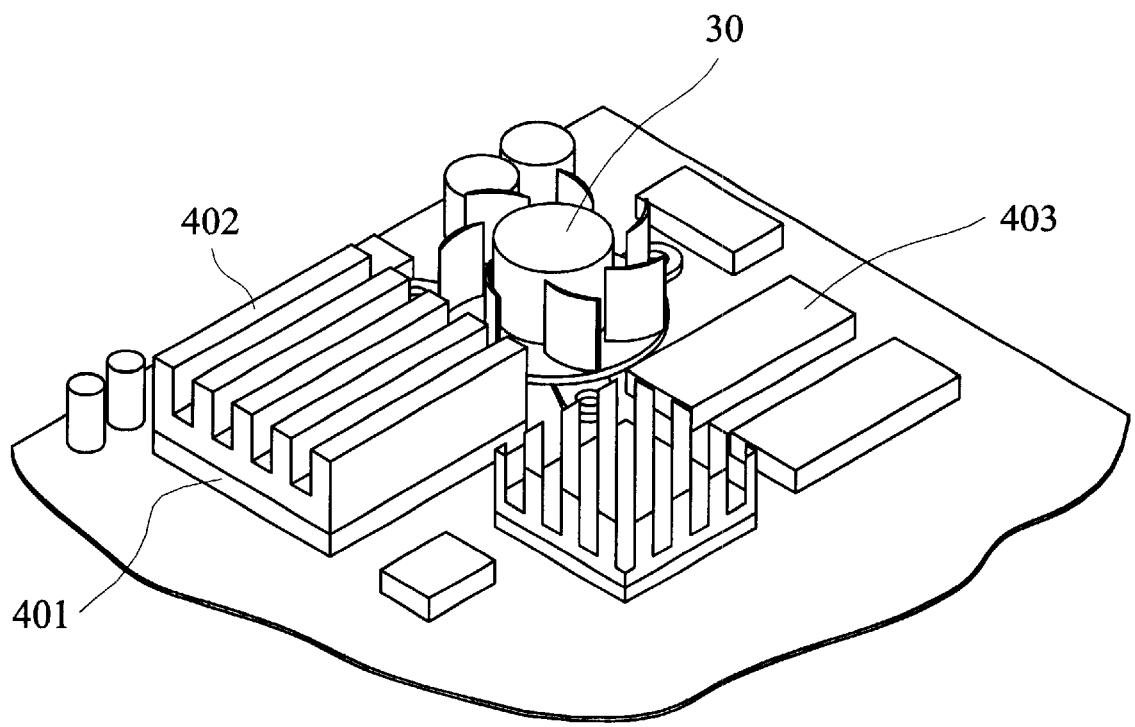
FIG. 4 is a partial schematic illustration showing the heat dissipation device in FIG. 3B mounted in an electrical device.

Referring to FIG. 4, since the heat dissipation device 30 is small in size and simple in structure, one could use it in conjunction with peripheral electrical elements or other heat dissipation elements. For instance, one could use the heat dissipation device 30 in conjunction with a heat dissipation plate 402 on an electrical element 401. This arrangement will dissipate heat not only from the electrical element 401 but also from electrical element 403 without either the limitations of size or the limitations of air-flow direction caused by the outer frame 13 of the conventional heat dissipation fan 10 as shown in FIG. 1.

Moreover, because the heat dissipation device of the invention is of an open-type structure, in which the base is located under the rotor and the stator without enclosing them, the size of the heat dissipation device is minimized. In addition, the height of the heat dissipation device is minimized to a value of the sum of the heights of both the rotor and the base.

Furthermore, because the heat dissipation device according to the invention includes a centrifugal fan, a larger air pressure can be obtained in comparison with an axial-flow fan. As a result, the heat dissipation device according to the invention is more suitable for an electrical device having a large system resistance.

While the invention has been described by way of example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A heat dissipation devise comprising:
    a rotor comprising a hub around which a projecting portion is located;
    a rotation shaft vertically situated at the center of an inner top-side of said hub;
    a plurality of centrifugal blades arranged around said rotor and being located around said projecting portion;
    a stator located inside said rotor for driving said rotor to rotate; and
    a base located under said rotor, said base being configured such that air flow generated by said plurality of centrifugal blades has an unobstructed flow path along a periphery of said base.

2. The heat dissipation device according to claim 1, wherein the rotor comprises:

a shielding can located inside said hub; and a rotor magnet around the inside of said shielding can.

3. The heat dissipation device according to claim 1, wherein said stator comprises:

a magnetic element;

an insulation portion around the outside of said magnetic element;

a coil wrapped around said insulation portion; and a circuit board located under said magnetic element, said coil, and said insulation portion.

4. The heat dissipation device according to claim 1, wherein said base comprises:

a central portion connected with said stator; and a plurality of extension portions extending from said central portion to the outside, and a plurality of holes formed at a side of each of said plurality of extension portions away from said central portion, respectively.

5. A heat dissipation devise comprising:

a rotor comprising a hub around which a projecting portion is located;

a rotation shaft vertically situated at the center of an inner top-side of said hub;

a plurality of centrifugal blades arranged around said rotor and being located around said projecting portion;

a stator inside said rotor for driving said rotor to rotate; and a base located under said rotor, said base including a central portion connected with said stator, and a plurality of extension portions extending from said central portion to the outside, and a plurality of holes formed at a side of each of said plurality of extension portions away from said central portion, respectively, and said base being configured such that air flow generated by said plurality of centrifugal blades has an unobstructed flow path along a periphery of said base.

6. The heat dissipation device according to claim 5, wherein the rotor comprises:

a shielding can inside said hub; and a rotor magnet around the inside of said shielding can.

7. The heat dissipation device according to claim 5, wherein said stator comprises:

a magnetic element;

an insulation portion around the outside of said magnetic element;

a coil provided around said insulation portion; and a circuit board under said magnetic element, said coil, and said insulation portion.

* * * * *